United States Patent [19]
Sakemi et al.

[11] Patent Number: 5,890,283
[45] Date of Patent: Apr. 6, 1999

[54] APPARATUS AND METHOD FOR MOUNTING ELECTRICALLY CONDUCTIVE BALLS

[75] Inventors: Shoji Sakemi; Tadahiko Sakai, both of Fukuoka, Japan

[73] Assignee: Matsushita Electric Industrial Co., Ltd., Osaka, Japan

[21] Appl. No.: 825,380

[22] Filed: Mar. 28, 1997

[30] Foreign Application Priority Data

Apr. 1, 1996 [JP] Japan ..................................... 8-078544
Aug. 22, 1996 [JP] Japan ..................................... 8-220928

[51] Int. Cl.[6] ..................................................... H05K 3/34
[52] U.S. Cl. ........................ 29/840; 29/740; 228/180.21; 228/180.22
[58] Field of Search ................ 29/840, 740; 228/180.21, 228/180.22

[56] References Cited

U.S. PATENT DOCUMENTS

| | | | |
|---|---|---|---|
| 4,292,116 | 9/1981 | Takahashi et al. | 29/740 X |
| 5,467,913 | 11/1995 | Namekawa et al. | 228/41 |
| 5,547,740 | 8/1996 | Higdon et al. | 428/209 |
| 5,601,229 | 2/1997 | Nakazato et al. | 288/246 |
| 5,722,160 | 3/1998 | Uemura et al. | 29/840 |
| 5,729,894 | 3/1998 | Rostoker et al. | 29/840 X |

*Primary Examiner*—Joseph J. Hail, III
*Assistant Examiner*—William Hong
*Attorney, Agent, or Firm*—Stevens, Davis, Miller & Mosher, L.L.P.

[57] ABSTRACT

An apparatus for mounting electrically conductive balls includes a mounting head which has an attracting tool with a number of attracting holes in its lower surface and attracts electrically conductive balls through a vacuum. The attracting tool is resiliently supported by the mounting head through springs. A flux is stored in a container at a predetermined depth. The electrically conductive balls attracted to the attracting tool project from its lower surface by a length larger than the depth of the flux. When the attracting tool is lowered, the electrically conductive balls contact a bottom surface of the container in a resilient manner due to spring tension of the springs. Then, by raising the attracting tool, the flux adheres to lower surfaces of the electrically conductive balls. With the flux kept at a proper depth, it can be made adhere in appropriate amount to all the electrically conductive balls at one time. It is thus possible to adhere a flux or adhesive in an appropriate amount to a number of electrically conductive balls with high working efficiency and improve productivity of workpieces with bumps considerably.

8 Claims, 6 Drawing Sheets

APPARATUS AND METHOD FOR MOUNTING ELECTRICALLY CONDUCTIVE BALLS

BACKGROUND OF THE INVENTION

The present invention relates to an apparatus and a method for mounting electrically conductive balls which are used in the process of manufacturing workpieces with bumps.

One of known methods for forming bumps, i.e., protrudent electrodes, on a workpiece in the manufacture process of workpieces with bumps, such as flip chips, employs electrically conductive balls such as solder balls. With this known method, bumps are formed by placing solder balls on the electrodes of a workpiece, and then heating, melting and solidifying the solder balls.

When the bumps are formed on the electrodes of a workpiece, a flux is used to make the solder balls cling onto the workpiece electrodes with good wetness. Heretofore, the flux has been coated on the workpiece electrodes by application means such as a dispenser or a transfer pin.

With the conventional coating method using a dispenser or a transfer pin, however, the flux must be applied on a multiplicity of workpiece electrodes in a spotted pattern. Accordingly, not only has a considerable tact-time (i.e., production time for each part) been required to apply the flux on all the electrodes, resulting in poor productivity, but also the amount of application of the flux has been apt to vary electrode by electrode. Another problem is that the maintenance such as routine management of the dispenser or daily cleaning of the transfer pin requires a lot of labor.

SUMMARY OF THE INVENTION

The present invention has an object of providing an apparatus and a method for mounting electrically conductive balls, which enable a flux to adhere in an appropriate amount to each of numerous electrically conductive balls with high efficiency, and which can greatly improve the productivity of workpieces with bumps.

According to one aspect of the invention, an apparatus for mounting electrically conductive balls comprises a workpiece positioning section, an electrically conductive ball supply section, a flux or adhesive reservoir, a mounting head, a vertically moving mechanism for moving the mounting head vertically, and a transfer mechanism for moving the mounting head between the workpiece positioning section and the electrically conductive ball supply section. The mounting head includes an attracting tool with attracting holes for the electrically conductive balls formed in a lower surface thereof. The flux or adhesive reservoir comprises a container for storing a flux or adhesive and an adjusting device for adjusting a depth of the flux or adhesive in the reservoir to be smaller than a length by which the electrically conductive balls held in the attracting holes through a vacuum project from the lower surface of the attracting tool, so that the electrically conductive balls held in the attracting holes through the vacuum are brought into contact with a bottom surface of the container to cause the flux or adhesive to adhere to lower surfaces of the electrically conductive balls.

In a mounting apparatus according to another aspect of the invention, the mounting head comprises a lift member movable up and down by the vertically moving mechanism, an attracting tool provided on the lift member and having attracting holes for electrically conductive balls formed in a lower surface thereof, and a pressing mechanism for pressing the attracting tool downward. A pressing force change device is further provided for varying the strength of pressing force developed by the pressing mechanism between when the electrically conductive balls attracted to the attracting tool are brought into contact with a bottom surface of the reservoir to make the flux or adhesive adhere to the electrically conductive balls, and when the electrically conductive balls are mounted on a workpiece positioned in the workpiece positioning section.

According to still another aspect of the invention, a method for mounting electrically conductive balls comprises a step of moving an attracting tool having attracting holes formed in a lower surface thereof, along with the electrically conductive balls held in the attracting holes through a vacuum, to a position above a container storing a flux or adhesive, a step of adjusting a depth of the flux or adhesive in the container to be smaller than a length by which the electrically conductive balls held in the attracting holes project from the lower surface of the attracting tool, a step of lowering the attracting tool by operation of a vertically moving mechanism to bring the electrically conductive balls attracted to the attracting tool into contact with a bottom surface of the container, and then operating the vertically moving mechanism in the opposite direction to raise the attracting tool, causing the flux or adhesive to adhere to lower surfaces of the electrically conductive balls, a step of moving the attracting tool to a position above a workpiece, and a step of lowering the attracting tool by operation of the vertically moving mechanism to bring the electrically conductive balls into contact with respective electrodes of the workpiece, and then raising the attracting tool to mount the electrically conductive balls on the electrodes of the workpiece.

A method for mounting electrically conductive balls, according to still another aspect of the invention, comprises a step of supplying a flux or adhesive in a predetermined thickness over a bottom surface of a container, attracting the electrically conductive balls in attracting holes formed in a lower surface of an attracting tool, a step of bringing the electrically conductive balls attracted to the attracting tool into contact with the bottom surface of the container, causing the flux or adhesive to adhere to the electrically conductive balls, while the attracting tool is pressed downward under first pressing force, and a step of pressing the electrically conductive balls with the flux or adhesive adhered thereto against a workpiece to mount the electrically conductive balls on the workpiece, while the attracting tool is pressed downward under second pressing force larger than the first pressing force.

With the invention, by properly controlling a surface level of the flux or adhesive, i.e., a depth thereof, stored in the container, the flux or adhesive can be made to adhere in an appropriate amount to all the numerous electrically conductive balls, which are drawn to the lower surface of the lower surface of the attracting tool through vacuum attraction, at one time by the vertical movement of the attracting tool in one reciprocal stroke. Therefore, workpieces with bumps can be manufactured with high working efficiency while forming bumps of good quality on electrodes of the workpiece.

Further, the pressing force for making the flux adhere to the electrically conductive balls in the reservoir is set smaller than the pressing force for mounting the electrically conductive balls on the workpiece positioned in the workpiece positioning section. Therefore, drawbacks that the flux may adhere to the attracting tool or that the electrically conductive balls mounted may shift from proper positions, can be avoided. It is thus possible to reliably carry out the operation of mounting the electrically conductive balls.

DESCRIPTION OF THE EMBODIMENTS

Embodiments of the present invention will be described hereunder with reference to the drawings.

Figure 1:
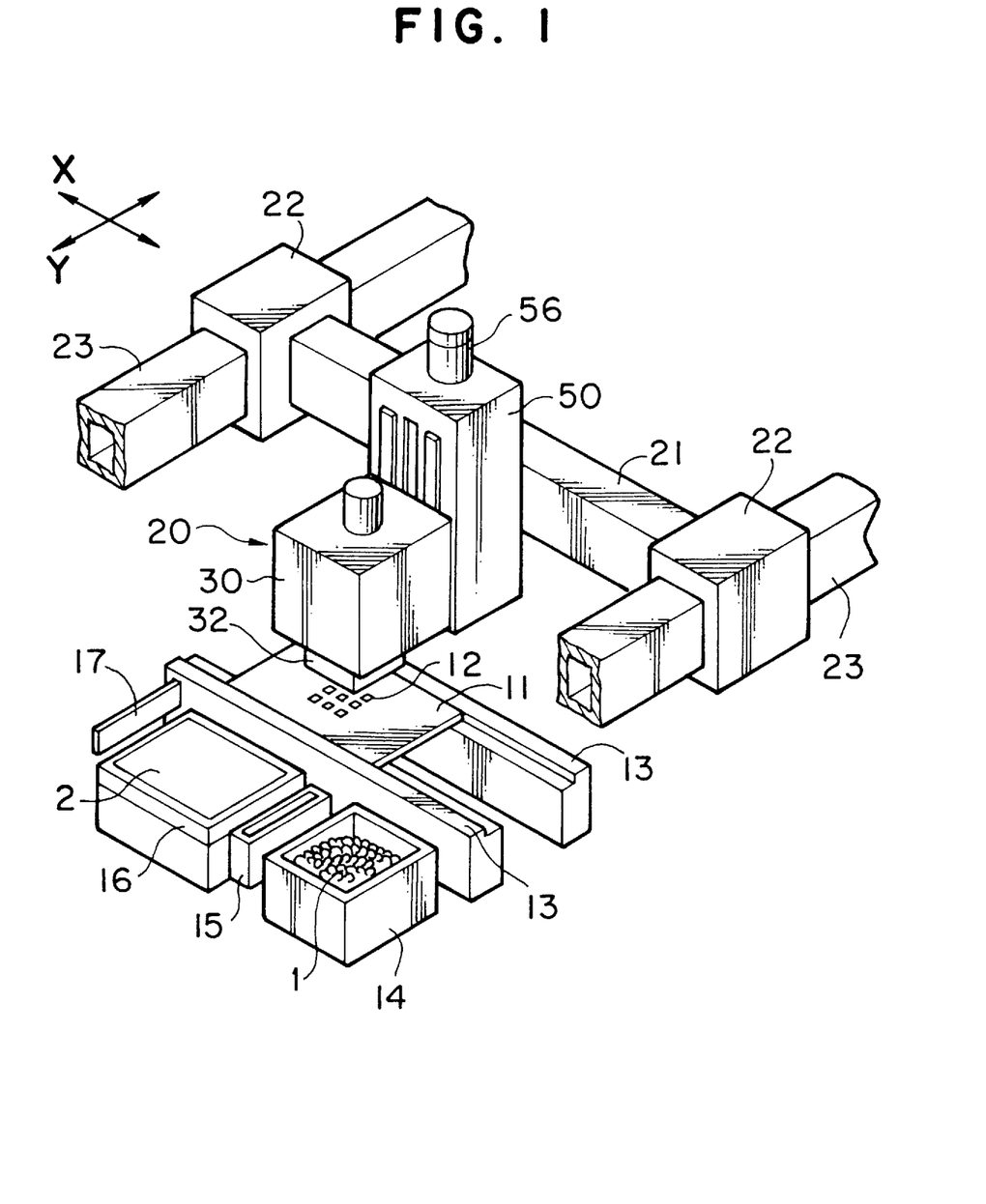
FIG. 1 is a perspective view of an apparatus for mounting electrically conductive balls according to the first embodiment of the invention.
Figure 2:
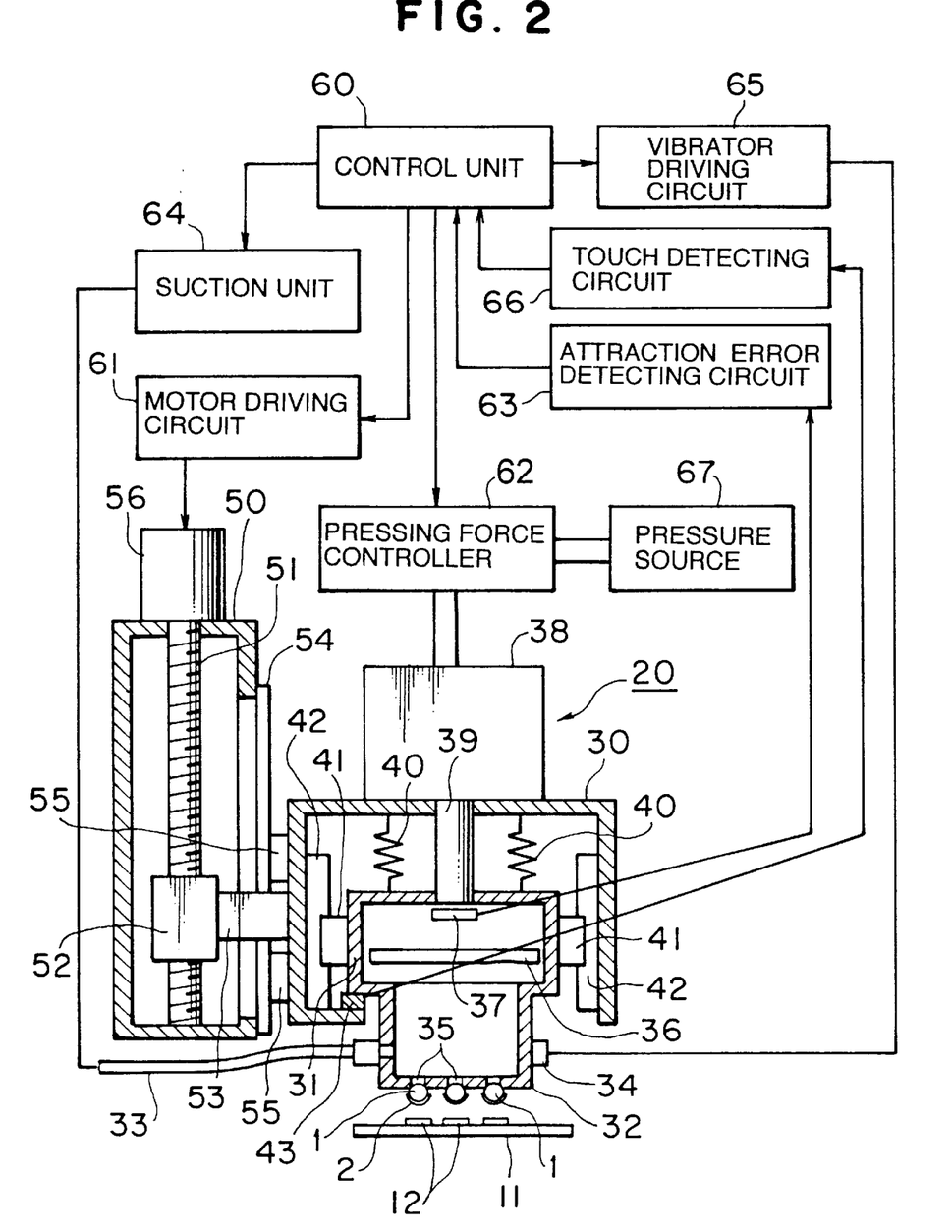
FIG. 2 is a sectional view of a mounting head in the apparatus of FIG. 1.
Figure 3:
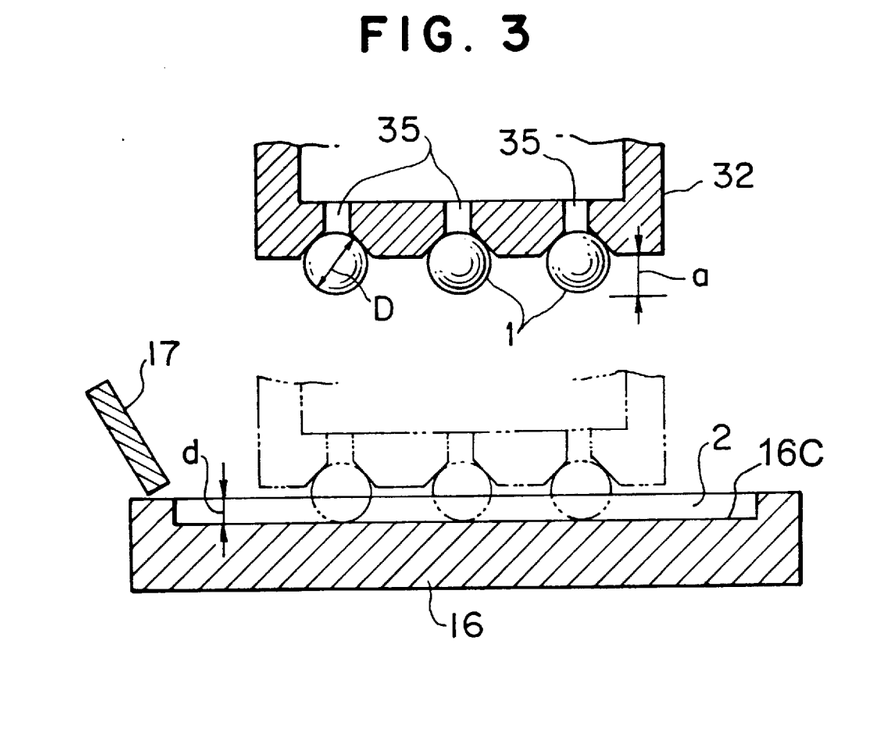
FIG. 3 is a view for explanation of the operation of making a flux adhere to the balls in the apparatus of FIG. 1.
Figure 4:
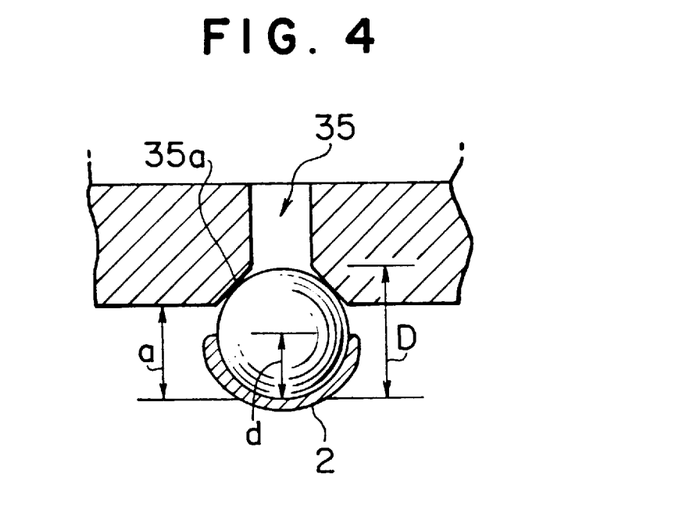
FIG. 4 is a fragmentary, enlarged sectional view of an attracting tool in the apparatus of FIG. 1.

FIG. 1 shows an apparatus for mounting electrically conductive balls according to an embodiment of the invention, FIG. 2 is a sectional view of a mounting head in the apparatus, FIG. 3 is an explanatory view for the operation of making a flux adhere to the balls in the apparatus, FIG. 4 is a fragmentary, enlarged sectional view of an attracting tool in the apparatus, and FIGS. 5a to 5d are explanatory views for the operation of mounting solder balls in the apparatus.

The following description, to ensure consistency of the description, will be made, by way of example, on the case where electrically conductive balls are solder balls and a workpiece is a substrate. The invention, however, is not limited to these. For example, the electrically conductive balls may be balls made of gold or silver, or resin balls coated with an electric conductor on their surfaces, other than the solder balls. Also, the "workpiece" may be semiconductor devices, packaged electronic parts, or the like.

In FIG. 1, numeral 11 denotes a substrate which is rested on a pair of guide rails 13. The guide rails 13 serve as a positioning section for clamping and positioning the workpiece. A number of electrodes 12 are formed on an upper surface of the workpiece 11, and solder balls 1 as electrically conductive balls will be mounted on the respective electrodes 12. A supply section 14 for the solder balls 1, a light source 15 for detecting pickup errors, and a container 16 as a flux reservoir are disposed on one side of the guide rails 13. Reference numeral 17 denotes a squeegee for leveling the surface of a flux 2. By moving the squeegee 17 over the container 16 along its upper surface, the flux 2 is supplied on a bottom surface 16c (shown in FIG. 3) of the container 16 with a predetermined thickness, preferably a thickness not larger than half a diameter of the solder balls 1 (see FIG. 8a). The supply section 14 comprises a box, in which the solder balls 1 are stored.

A mounting head 20 is disposed above the guide rails 13. The mounting head 20 is movable in the X-direction along a guide shaft 21. The guide shaft 21 is coupled at its both ends to guide shafts 23 through sliders 22 so that the guide shaft 21 is movable in the Y-direction along the guide shafts 23. Thus, the guide shafts 21, 23 serve as moving means for allowing the mounting head 20 to move in the X- and Y-directions. Incidentally, a power system for moving the mounting head 20 along the guide shafts 21, 23 is not described here.

The structure of the mounting head 20 will now be described with reference to FIG. 2. Denoted by numeral 30 is a box serving as a lift member. The box 30 is open at its bottom and houses a case 31 therein. A box-shaped attracting tool 32 is joined to a lower end of the case 31. The attracting tool 32 has a number of attracting holes 35 formed in its lower surface, and is connected to a suction unit 64 through a tube 33. The operation of the suction unit 64 enables the attracting tool 32 to draw the solder balls 1 to the attracting holes 35 under the action of a vacuum. Also, by operating the suction unit 64 reversely, air is introduced to the attracting holes 35 to break the vacuum.

Within the case 31, a light condensing element 36 and a photosensor 37 are provided. A cylinder 38 capable of operating under pneumatic pressure is disposed on an upper surface of the box 30, and has a rod 39 to a lower end of which is joined the case 31. Numeral 40 denotes a spring interconnecting a ceiling of the box 30 and an upper surface of the case 31. Spring tension developed by the springs 40 serve to normally raise the case 31 upward and cancel the own weight of the components on the side of the attracting tool 32. In this embodiment, the spring tension of the springs 40 is set equal to the weight of both the case 31 and the attracting tool 32. Sliders 41 provided on both lateral surfaces of the case 31 are slidably engaged with vertical rails 42 provided on inner surfaces of the box 30, respectively. Thus, the attracting tool 32 is attached to the box 30 through the case 31 for vertical movement. Alternatively, the attracting tool 32 may be directly attached to the box 30 in a vertically movable manner. A touch sensor 43 is disposed on the underside of the box 30.

Means for moving the box 30 vertically will now be described. Denoted by numeral 50 is a vertically elongate driving case which is provided on one side of the box 30 and houses a vertically extending ball screw 51 therein. A nut 52 meshes with the ball screw 51 and is connected to the box 30 through a rod 53. A vertical rail 54 is provided on a lateral surface of the driving case 50, with which slidably engaged is a slider 55 provided on a lateral surface of the case 30. When a motor 56 drives the ball screw 51 for rotation, the nut 52 is vertically moved along the ball screw 51. As a result, the box 30 and the attracting tool 32 are also vertically moved.

Reference numeral 60 denotes a control unit for controlling a motor driving circuit 61, a pressing force controller 62, an attraction error detecting circuit 63, a suction unit 64, a vibrator driving circuit 65, and so on. Also, the control unit 60 receives a signal from a touch detecting circuit 66 connected to the touch sensor 43. The motor driving circuit 61 controls the motor 56. The pressing force controller 62 controls the cylinder 38. The attraction error detecting circuit 63 detects, based on a signal from the photosensor 37, whether there is an attraction error. Further, as shown in FIG. 2, a vibrator 34 is attached to one lateral surface of the attracting tool 32, which ultrasonically vibrates the attracting tool 32 under control of the vibrator driving circuit 65.

Referring to FIG. 3, the container 16 is in the form of a shallow box wherein the flux 2 is stored as a thin layer. A depth d of the flux 2 is selected to be about half a diameter D of the solder balls 1. As shown in FIG. 4, a lower portion of each attracting hole 35 is chamfered to provide a beveled surface 35a. The solder ball 1 is attracted to the beveled surface 35a under the action of a vacuum. A length a by which the solder ball 1 projects from a lower surface of the attracting tool 32 while being attracted thereto is set slightly larger than the depth d of the flux 2.

FIG. 3 depicts the operation of moving the attracting tool 32 vertically to make the flux 2 adhere to lower surfaces of the solder balls 1. First, the attracting tool 32 is moved downward until the solder balls 1 reach the inner bottom surface of the container 16. At this time, since the own weight of the attracting tool 32 is canceled out by the spring tension of the springs 40 and the force of the cylinder 38 pushing the attracting tool 32 is set relatively small, the solder balls 1 come into contact with the bottom surface of the container 16 in a resiliently cushioned soft manner. Further, since the lower portions of the attracting holes 35 have the beveled surfaces 35a, the solder balls 1 will not firmly fit into the respective attracting holes 35 even with an impact caused upon contacting the bottom surface of the container 16. Therefore, when the solder balls 1 are mounted on the electrodes 12 of the base board 11 in a later step, it is possible to prevent a mounting error that would otherwise occur because of any solder ball 1 being not released from the attracting hole 35. In addition, although the solder balls 1 are made of a relatively soft solder alloy, they will not deform with an impact caused upon contacting the container 16, because the balls contact it softly.

As described above with reference to FIG. 4, the solder balls 1 project from the lower surface of the attracting tool 32 by the length a which is set slightly larger than the depth d of the flux 2. As indicated by chain lines in FIG. 3, therefore, in the state where the solder balls 1 are in contact with the inner bottom surface of the container 16, the lower surface of the attracting tool 32 is kept from dipping into the flux 2 and hence the flux 2 is prevented from adhering there. Then, by raising the attracting tool 32 from the container 16, the flux 2 may adhere in an appropriate amount to the lower surfaces of the solder balls 1, as shown in FIG. 4, corresponding to the depth d of the flux 2. On this occasion, a number of solder balls 1 are held on the lower surface of the attracting tool 32 through vacuum attraction, but those solder balls 1 can be all dipped in the flux 2 in the predetermined depth d so that the flux 2 adheres in an appropriate amount to all the solder balls 1 uniformly at one time.

After thus making the flux 2 adhere to the solder balls 1, the mounting head 20 is moved to a position above the base board 11. By lowering and then raising the mounting head 20 in that position, the solder balls 1 are mounted on the electrodes 12 of the base board 11.

Figure 5A:
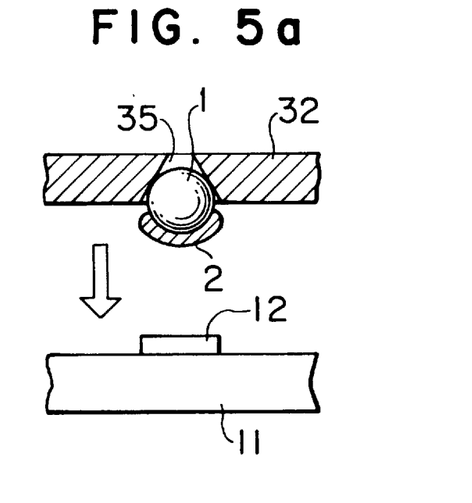
FIGS. 5a to 5d are views for explanation of the operation of mounting solder balls in the apparatus of FIG. 1.

FIGS. 5a to 5d show the operation of mounting the solder balls 1 in detail, respectively. First, as shown in FIG. 5a, the attracting tool 32 is lowered toward the substrate 11. This downward movement is effected by energizing the motor 56 to rotate forward.

Figure 5B:
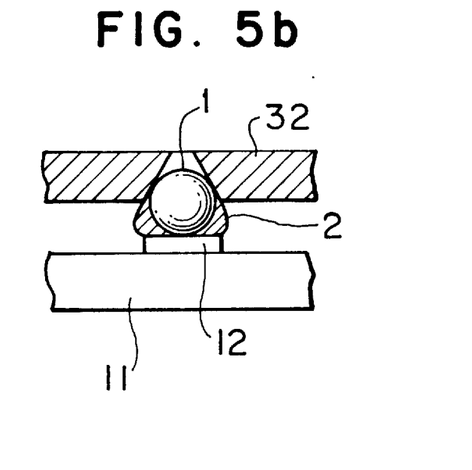

Subsequently, when the solder balls 1 reach the respective electrodes 12 as shown in FIG. 5b, the attracting tool 32 slightly rises with respect to the box 30 due to the reaction while pushing the rod 39 of the cylinder 38 upward in FIG. 2. Accordingly, the underside of the case 31 detaches from the touch sensor 43, enabling the detection that the solder balls 1 have been in contact with the electrodes 12. Upon this detection, the motor 56 stops driving at once to cease the downward movement of the attracting tool 32.

In the state where the solder ball 1 is in contact with the electrode 12 as shown in FIG. 5b, the downward force caused by the forward rotation of the motor 56 will not act as force pressing the solder ball 1 against the electrode 12. The reason is that when the solder balls 1 land on the electrode 12, the case 31 and the attracting tool 32 rise from the bottom of the box 30 and the downward force developed by the forward rotation of the motor 56 is no longer transmitted to the attracting tool 32. In addition, the weight of both the case 31 and the attracting tool 32 will not also act as force pressing the solder balls 1. This is because the weight of both the case 31 and the attracting tool 32 is canceled out by the upward spring tension of the springs 40. Only the pushing force that is developed by the cylinder 38 operating to extend the rod 39 downward acts as force pressing the solder balls 1 against the electrode 12. In other words, the cylinder 38 serves as means for pressing the solder balls 1 against the electrodes 12 under adequate force, and the pushing force thereof sets the strength of force pressing the solder ball 1 against the electrode 12 of the base board 11. Accordingly, by controlling the pushing force of the rod of the cylinder 38, the solder balls 1 can be pressed against the electrodes 12 under such an adequate force as ensuring that the solder balls 1 will not fit into the respective attracting holes 35 or collapse themselves.

Figure 5C:
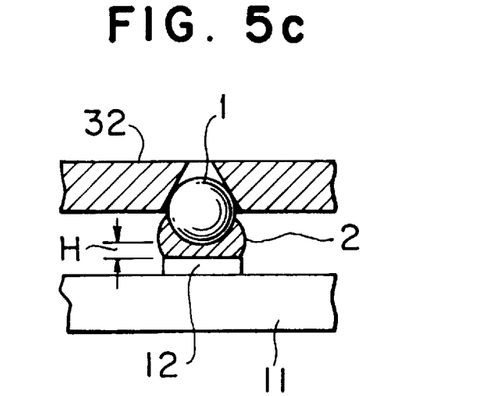
Figure 5D:
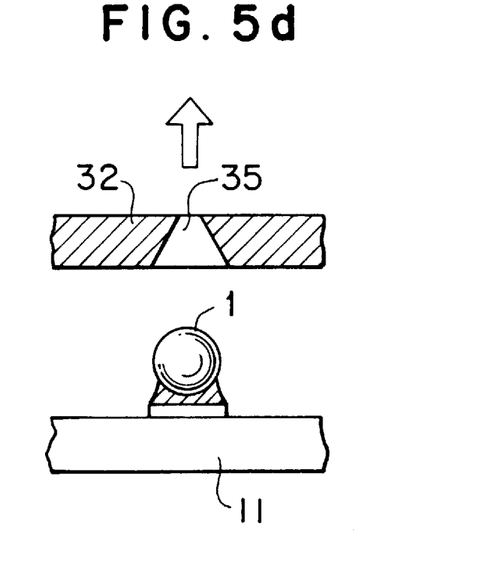

Then, the motor 56 is slightly rotated backward to raise the attracting tool 32 by a bit of height H, for example, about 0.1 to 0.15 mm. Here, the diameter of the solder ball 1 is about 1 mm in this embodiment. This causes the lowermost surfaces of the solder balls 1 to rise from the electrodes 12 by the slight height H of about 0.1 to 0.15 mm, allowing the adhesive flux 2 to interpose between the solder balls 1 and the respective electrodes 12 (FIG. 5c). Then, by releasing the solder balls 1 from the state under vacuum attraction and rotating the motor 56 backward to raise the attracting tool 32, the solder balls 1 separate from the attracting holes 35 and rest on the respective electrodes 12 (FIG. 5d). At this time, since the solder balls 1 are clung to the electrodes 12 by adhesion of the flux 12, the solder balls 1 are surely separated from the attracting holes 35 and mounted on the electrodes 12 upon rising of the attracting tool 32. Furthermore, by energizing the vibrator 34 to ultrasonically vibrate the attracting tool 32 when the solder balls 1 are separated from the attracting holes 35, it is possible to more positively detach the solder balls 1 from the attracting holes 35.

Once the solder balls 1 are mounted on the substrate 11 through the above steps, the workpiece 11 is delivered to a subsequent process along the guide rails 13. Then, a new workpiece 11 is introduced to the position shown in FIG. 2 over the guide rails 13, followed by repeating the above steps.

Figure 6:
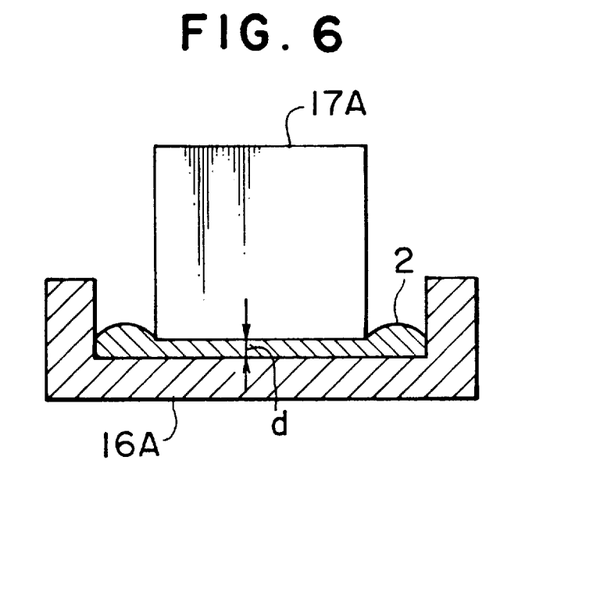
FIG. 6 is a sectional view of a flux reservoir in an apparatus for mounting electrically conductive balls according to the second embodiment of the invention.

FIG. 6 shows a flux reservoir in an apparatus for mounting electrically conductive balls according to the second embodiment of the invention. A container 16A is deeper than the container 16 in the first embodiment, and the flux 2 is stored as a relatively thick layer. In this embodiment, the flux 2 is leveled in its upper surface to have the same depth d as in the first embodiment by adjusting the height of a lower surface of a squeegee 17A. As a result, this embodiment can also provide similar advantages to those in the first embodiment.

Figure 7:
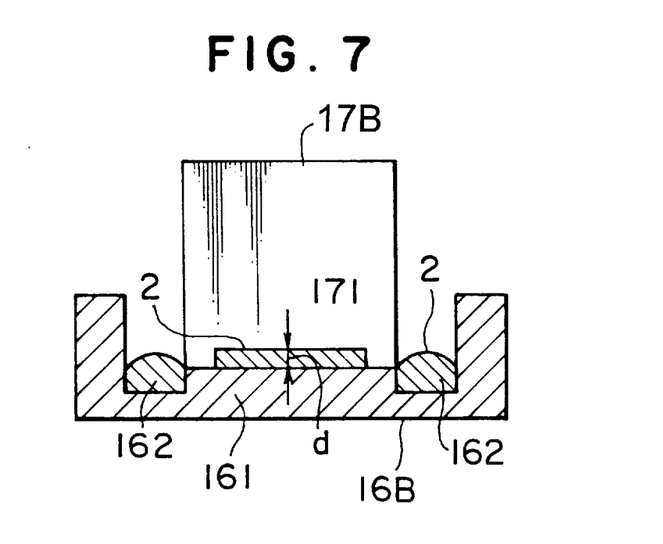
FIG. 7 is a sectional view of a flux reservoir in an apparatus for mounting electrically conductive balls according to the third embodiment of the invention.

FIG. 7 shows a flux reservoir in an apparatus for mounting electrically conductive balls according to the third embodiment of the invention. A container 16B has grooves 162 formed therein on opposite sides of its bottom surface, and a squeegee 17B is adapted to slide over a central projection 161. A recess 171 having a depth d is formed in a lower surface of the squeegee 17B. Accordingly, by sliding the squeegee 17B along the central projection 161, a film of the flux 2 having the depth d is produced. This embodiment can also provide similar advantages to those in the first embodiment. In the first and second embodiments, the attracting tool 32 is lowered to make the flux 2 adhere to the solder balls 1 immediately after sliding the squeegees 17A, 17B. Because of the flux 2 having viscosity, the film of the flux 2 can be maintained at the predetermined depth d for a while even after sliding of the squeegees 17A, 17B.

Figure 8A:
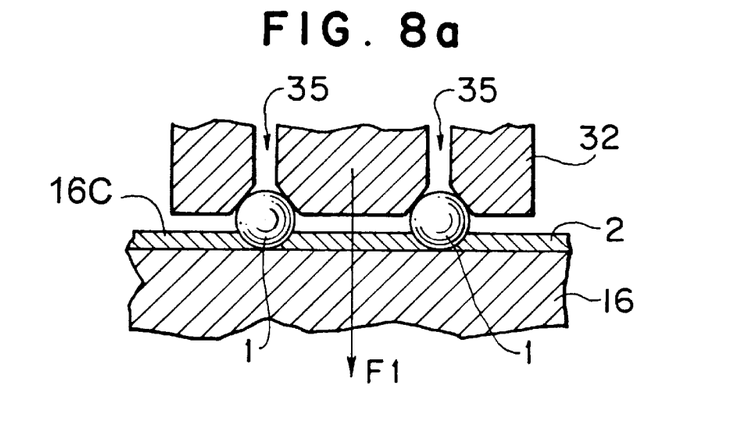
FIGS. 8a to 8c are explanatory views for the operation of mounting electrically conductive balls in a mounting apparatus according to the fourth embodiment of the invention.
Figure 8B:
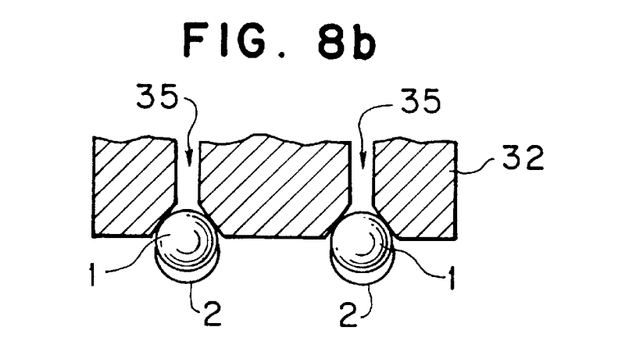
Figure 8C:
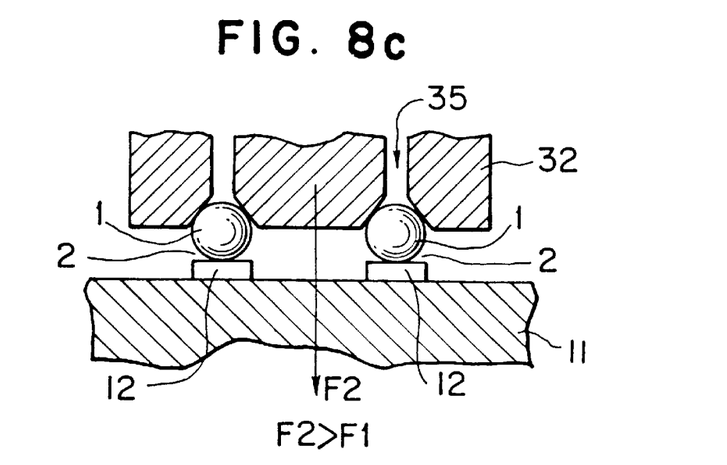

FIGS. 8a to 8c are explanatory views for the operation of mounting electrically conductive balls in a mounting apparatus according to the fourth embodiment of the invention. The pressing force controller 62 adjusts the pressure of a pressure source 67 to control the cylinder 38 in accordance with a command from the control unit 60, thereby adjusting pressing force for pushing the attracting tool 32 downward. As this pressing force, a first pressing force F1 to be applied when making the flux adhere to the solder balls 1 is set to about 0.5 to 20 gf for each of the solder balls 1, and a second pressing force F2 to be applied when mounting the solder balls 1 on the electrodes 12 is set to about 25 to 100 gf in a similar manner. The pressing force controller 62 is operated to switchingly provide the set pressing forces F1, F2 at proper timing in match with the operation of the apparatus.

In this embodiment, the control unit 60 and the pressing force controller 62 serve as pressing force change means for varying the pressing force applied to the attracting tool 32.

The operation of the thus-constructed apparatus for mounting electrically conductive balls will now be described. Referring to FIG. 1, the mounting head 20 is moved to a position above the supply section 14. After that, by energizing the motor 56 shown in FIG. 2, the mounting head 20 is lowered and then raised to pick up the solder balls 1 at the attracting holes 35 in the lower surface of the attracting tool 32 through a vacuum.

Subsequently, the mounting head 20 is moved to a position above the container 16. In the course of this movement, the mounting head 20 passes over the light source 15 which irradiates light toward the lower surface of the attracting tool 32. Referring to FIG. 2, if any attracting hole 35 has no solder ball 11 through vacuum attraction, i.e., if there is a pickup error of the solder ball 1, the light enters the photosensor 37 through the attracting hole 35 left open. This makes it possible to determine the occurrence of a pickup error. If there is a pickup error, the mounting head 20 is returned to the position above the supply portion 14 to perform the pickup operation again.

On the other hand, while the mounting head 20 picks up the solder balls 1, the squeegee 17 is moved over the container 16 to provide a layer of the flux 2 having the predetermined thickness on the bottom surface 16a of the container 16.

If there is no pickup error, the mounting head 20 is moved to the position above the container 16. By moving the attracting tool 32 vertically there through the driving of the motor 56, the flux 2 stored in the container 16 adheres to the lower surfaces of the solder balls 1 (step 1). Then, the mounting head 20 is moved to a position above the substrate where it is lowered and then raised to mount the solder balls 1 on the respective electrodes 12 of the substrate (step 2).

The pressing force acting on the solder balls 1 will now be described with reference to FIGS. 8a to 8c. First, as shown in FIG. 8a, the relatively small pressing force F1 is applied to the solder balls 1 in the above step 1 so that excessive force will no act on both the solder balls 1 and the lower surface of the attracting tool 32 when the solder balls 1 are brought into contact with the inner bottom surface 16a of the container 16. To this end, the pressing force controller 62 controls the cylinder 38 to push the attracting tool 32 downward under the relatively small pressing force F1. Therefore, the solder balls 1 come into contact with the bottom surface 16C of the container 16 under weak force, and the flux 2 is prevented from adhering to the attracting tool 32. This ensures that, in a next step of supplying the solder balls 1, any solder ball is kept from clinging to areas of the lower surface of the attracting tool 32 other than the attracting holes 35 due to splashing of the flux 2 to the attracting tool 32.

Subsequently, as shown in FIG. 8b, the solder balls 1 with the flux 2 adhered to their lower surfaces are transferred a position above the substrate 11 by moving the attracting tool 32.

Then, as shown in FIG. 8c, the pressing force controller 62 controls the cylinder 38 in the above step 2 so that the relatively large pressing force F2 acts on the attracting tool 32. Therefore, the solder balls 1 are firmly pressed against the electrodes 12, causing the flux 2 to spread over the respective electrodes 2 to develop sufficient adhesive force. Accordingly, when a vacuum is broken and the attracting tool 32 is raised, the solder balls 1 remain rested on the electrodes 12.

While the invention has been described above in connection with the first to fourth embodiments, the invention is applicable not only to the case of using solder balls to form bumps, but also to the case of using electrically conductive balls made of material having a small electrical resistance, such as gold. In the latter case, an adhesive is stored in the container rather than the flux, and the electrically conductive balls are mounted on electrodes of a workpiece after being coated with the adhesive. Operation in this case can be performed in the same manner as in the first to fourth embodiments.

What is claimed is:

1. An apparatus for mounting objects on a workpiece, said apparatus comprising:

a workpiece positioning section for positioning said workpiece;

a supply section for supplying said objects;

a flux or adhesive reservoir for holding a flux or adhesive, said reservoir having a bottom surface;

a mounting head for mounting said objects on said workpiece;

vertical movement causing means for moving said mounting head vertically;

transfer means for moving said mounting head between said workpiece positioning section and said supply section;

said mounting head including a lift member movable up and down by said vertical movement causing means, an attracting tool provided on said lift member and having attracting holes for said objects formed in a lower surface thereof, and means for moving said attracting tool downward by applying a force to said attracting tool; and force change means for varying a strength of said force developed by said means for moving between a first time when the objects attracted to said attracting tool are brought into contact with said bottom surface of said reservoir to make the flux or adhesive adhere to the objects, and a second time when the objects are mounted on said workpiece positioned in said workpiece positioning section.

2. An apparatus as in claim 1, wherein the objects are electrically conductive balls.

3. An apparatus as in claim 2, wherein the first and second forces are pressing forces.

4. An apparatus as in claim 2, wherein the mounting head further comprises a suction unit connected to the attracting head for providing a suction in the attracting holes.

5. A method for mounting objects onto a workpiece, the method comprising:

(a) supplying a flux or adhesive in a predetermined thickness over a bottom surface of a container;

(b) attracting the objects in attracting holes formed in a lower surface of an attracting tool;

(c) bringing the objects attracted to said attracting tool into contact with the bottom surface of the container, causing the flux or adhesive to adhere to the objects, while the attracting tool is moved downward under a first force; and (d) pressing the objects with the flux or adhesive adhered thereto against the workpiece to mount the objects on the workpiece, while the attracting tool is moved downward under a second force which is larger than the first force.

6. A method as in claim 4, wherein the objects are electrically conductive balls.

7. A method as in claim 4, wherein the first and second forces are pressing forces.

8. A method as in claim 4, wherein step (b) comprises providing a suction in the attracting holes.

* * * * *